US007508013B2

(12) United States Patent
Howard et al.

(10) Patent No.: US 7,508,013 B2
(45) Date of Patent: Mar. 24, 2009

(54) VERSATILE SYSTEM FOR CROSS-LATERAL JUNCTION FIELD EFFECT TRANSISTOR

(75) Inventors: Gregory E Howard, Dallas, TX (US); Leland Swanson, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 29 days.

(21) Appl. No.: 11/839,855

(22) Filed: Aug. 16, 2007

(65) Prior Publication Data

US 2007/0281407 A1 Dec. 6, 2007

Related U.S. Application Data

(62) Division of application No. 11/031,586, filed on Jan. 7, 2005, now Pat. No. 7,288,800.

(51) Int. Cl.
*H01L 29/74* (2006.01)
*H01L 31/111* (2006.01)

(52) U.S. Cl. .................. 257/134; 257/136; 257/347

(58) Field of Classification Search ............... 257/134, 257/136, 141, 217, 272–274, 347
See application file for complete search history.

(56) References Cited

U.S. PATENT DOCUMENTS

| 5,432,377 A | 7/1995 | Litwin |
| 6,396,108 B1 | 5/2002 | Krivokapic et al. |

*Primary Examiner*—Thien F Tran
(74) *Attorney, Agent, or Firm*—Jacqueline J. Garner; W. James Brady, III; Frederick J. Telecky, Jr.

(57) ABSTRACT

The present, invention provides a system for providing a cross-lateral junction field effect transistor (114) having desired high-performance desired voltage, frequency or current characteristics. The cross-lateral transistor is formed on a commercial semiconductor substrate (102). A channel structure (124) is formed along the substrate, having source (120) and drain (122) structures laterally formed on opposites sides thereof. A first gate structure (116) is formed along the substrate, laterally adjoining the channel structure orthogonal to the source and drain structures. A second gate structure (118) is formed along the substrate, laterally adjoining the channel structure, orthogonal to the source and drain structures and opposite the first gate structure.

5 Claims, 4 Drawing Sheets

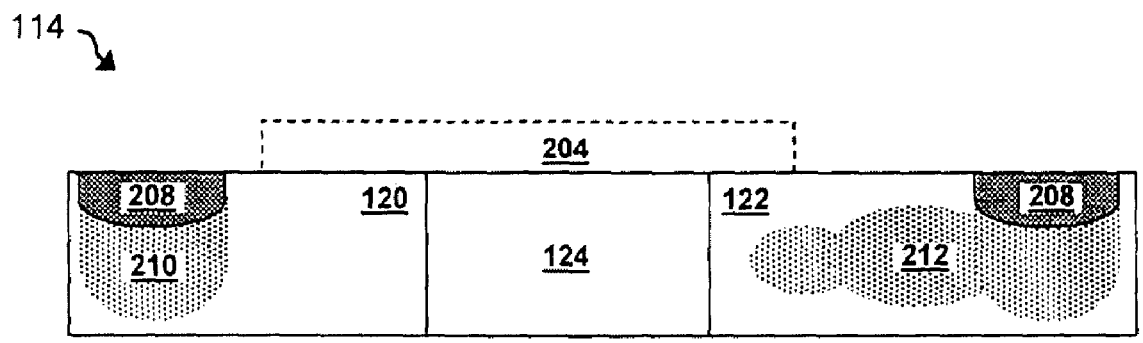
FIG. 2e
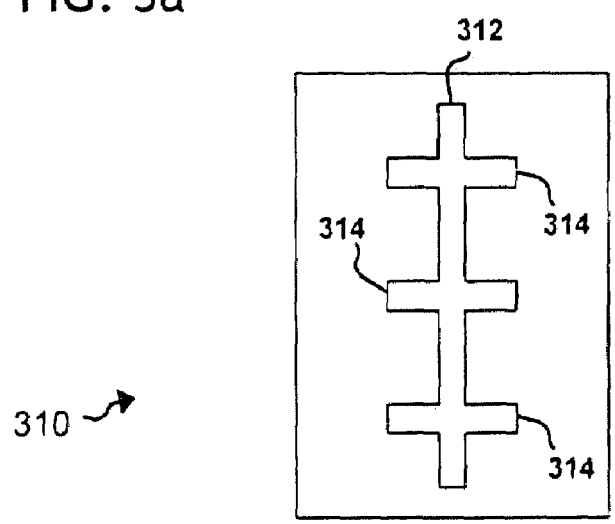
FIG. 3a
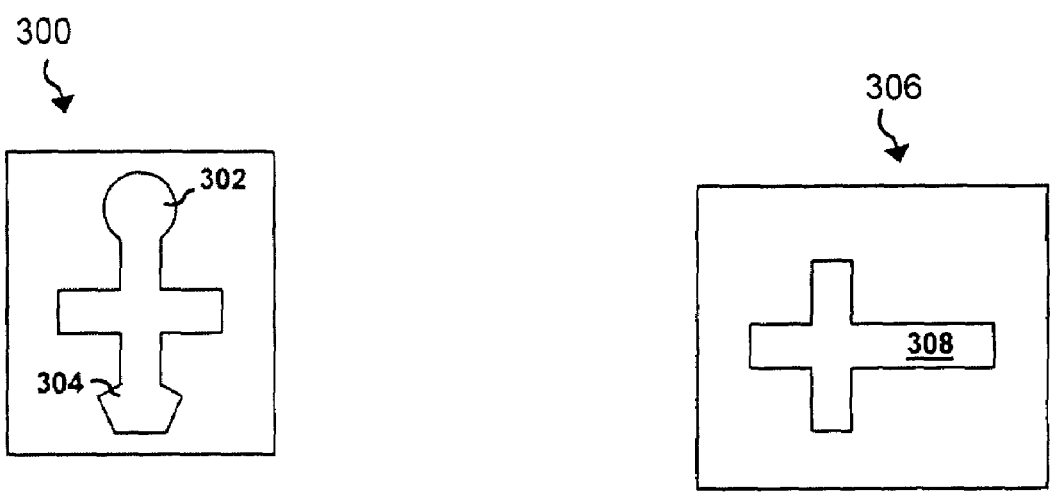
FIG. 3b
FIG. 3c

VERSATILE SYSTEM FOR CROSS-LATERAL JUNCTION FIELD EFFECT TRANSISTOR

This is a divisional application of Ser. No. 11/031,586 filed Jan. 7, 2005.

TECHNICAL FIELD OF THE INVENTION

The present invention relates generally to the field of semiconductor devices and more particularly, to apparatus and methods for the production of junction field effect transistors.

BACKGROUND OF THE INVENTION

The continual demand for enhanced integrated circuit performance has resulted in among other things, a dramatic reduction of semiconductor device geometries, and continual efforts to optimize the performance of every substructure within any semiconductor device A number of improvements and innovations in fabrication processes, material composition and layout of the active circuit levels of a semiconductor device have resulted in very high-density circuit designs. Increasingly dense circuit design has not only improved a number of performance characteristics, it has also increased the importance of, and attention to semiconductor material properties and behaviors.

The increased packing density of the integrated circuit generates numerous challenges to the semiconductor manufacturing process. Nearly every device must be smaller without degrading operational performance of the integrated circuitry. High packing density, low heat generation, and low power consumption, with good reliability must be maintained without any functional degradation. Increased packing density of integrated circuits is usually accompanied by smaller feature size.

As integrated circuits become denser, the dimensions of metal structures interconnecting transistors, channels between contacts, and other device features within an integrated circuit are significantly reduced—significantly altering the physical and electrical properties of those features. Ongoing efforts to reduce transistor geometries give rise to a number previously unaddressed performance and design issues, particularly in specialized or high-performance designs. Consider, for example, a junction field effect transistor (JFET).

Conventional JFETs are often produced in bipolar semiconductor technologies. These JFETs offer some beneficial properties, such as low leakage current and high current capacity, suitable for certain applications (e.g., buffers). Unfortunately, though, conventional JFETs have certain structural and behavioral properties that limit their usefulness in high-performance applications (e.g., high frequency, high voltage). In comparison to MOSFETs, JFETs have relatively high current capacities but relatively low gain. As such, some efforts have been made to produce JFETs retaining their beneficial properties, while adding certain performance properties that approach those of MOSFETs. This has, correspondingly, resulted in attempts to implement JFET architectures in commercial, MOS-type, photolithographic process technologies—raising a number of new issues and concerns.

Generally, the junction region of a JFET (i.e., the region comprising the interface of the channel and gate structures) is determinative of most of that JFET's performance characteristics. This is the region where voltage across the channel, and an electric field (or fields) resulting therefrom, alter depletion of charge under the gate—thereby altering the current throughput of the JFET. Thus, altering the structure, dimension or configuration of a JFET junction region can significantly contribute to or detract from that JFET's performance.

Conventional JFET structures typically comprise a central channel region within a base substrate, having a gate disposed atop it—forming the junction region. Laterally, along a single plane, the channel is bounded, on its sides, by areas doped to form the source and drain regions. Contacts are formed atop the source, drain and gate features to form the functional transistor. The gate is used to apply voltage to the junction region—pinching off the junction region and thereby controlling the current throughput of the JFET.

Within the junction region, a certain amount of non-linear parasitic capacitance originates from the interface between the channel and the gate (i.e., the top side of the channel). This parasitic capacitance can degrade the frequency performance of the JFET. Additionally, a certain amount of non-linear parasitic capacitance originates from each of the interfaces between the channel and the source and drain (i.e., the channel sidewalls). These interfaces—in comparison with the channel/gate interface—do nothing to contribute to controlling junction region pinch off. They do, however, contribute a significant amount of additional capacitance, greatly increasing the non-linearity of the parasitic capacitance and further impairing the frequency performance of the JFET. This effect is even more extensive in designs that implement a backside gate.

Certain JFET designs, depending upon the semiconductor process technology utilized, can or do provide a second gate structure (i.e., a "backside gate") disposed along the bottom surface of the channel. Where such a structure is present, the non-linear parasitic capacitance is increased even further—decreasing the JFET's frequency performance. In order for a backside gate structure to contribute to controlling junction field effects, a contact must be made for it. This translates to patterning, routing, or otherwise producing a contact on the backside of the substrate. In most commercial applications, however, this is extremely impractical due to the cost and process overhead involved. Thus, the presence of a backside gate typically adds nothing to the control of junction field effects while further degrading the frequency performance of the JFET.

Theoretically, these detrimental capacitance effects could be diminished if the length of the channel was reduced significantly. Unfortunately, most conventional fabrication processes (e.g., lithography) are limited in their ability to reliably produce transistor features of extremely small dimension. Even where the ability to produce extremely fine processing tool features (e.g., mask dimensions) might exist, the ability to accurately predict and tightly control inherent processing material effects (e.g., diffusive spreading) often does not. For example, assume that a gate mask having a length dimension of 0.3 µm can be successfully produced—to be used in implanting a device feature intended to have a gate length dimension of 0.3 µm. Implantation of a dopant through the mask may nonetheless yield a device feature having a length dimension of 0.4 µm, 0.5 µm or larger—depending upon the inherent diffusivity of the dopant material during implant. Aside from such production difficulties, an extremely fine channel structure would cause other performance problems—particularly with respect to frequency performance. A gate contact to an extremely narrow channel would have extremely high resistance that would, consequently, degrade the frequency response of the transistor. Thus, in conventional processes, the ability to limit detrimental capacitance effects through channel length reduction is of little practical value.

As a result, there is a need for a system that provides for the design and production of high performance JFET structures—capable of high current throughput at high voltages and high frequencies—using commercially viable semiconductor process technologies in an easy, efficient and cost-effective manner.

SUMMARY OF THE INVENTION

The present invention provides a versatile system, comprising a number of apparatus and methods, for the design and production of high performance JFET structures. The system of the present invention provides a cross-lateral JFET architecture that is highly versatile and readily adaptable to a number of design or performance requirements. JFETs according the present invention are nonetheless capable of high-voltage, high current throughput at high frequencies. Furthermore, using the system of the present invention, JFETs are readily produced using commercially viable semiconductor process technologies. The present invention thereby provides high performance JFETs in an easy, efficient and cost-effective manner.

Specifically, the system of the present invention provides a cross-lateral JFET architecture, defined by source/drain branches orthogonal to gate branches. The gate branches of this architecture provide a welt-defined gate modulation (or junction modulation) region. Parasitic capacitance effects originating from channel sidewalls are effectively eliminated. Non-linearity, otherwise associated with parasitic capacitance in conventional JFET designs, is minimized—providing optimal frequency performance. The dual gate configuration of the present invention provides dynamic pinch-off across the channel, improving the transistor gain ($g_m$). The outer regions of each cross-lateral branch are readily accessible to implantation processes, providing for independently selective doping profiles in each such branch. Furthermore, each such branch can be customized to provide, for example, a desired contact size or shape. The system of the present invention thus provides a wide range of transistor operational voltage ranges with only minor in-process adjustments.

More specifically, the present invention provides a system for providing a cross-lateral junction field effect transistor having desired high-performance voltage, frequency or current characteristics. The cross-lateral transistor is formed on a commercial semiconductor substrate. A channel structure is formed alone the substrate, having source and drain structures laterally formed on opposites sides thereof. A first gate structure is formed along the substrate, laterally adjoining the channel structure orthogonal to the source and drain structures. A second gate structure is formed along the substrate, laterally adjoining the channel structure, orthogonal to the source and drain structures and opposite the first gate structure.

Other features and advantages of the prevent invention will be apparent to those of ordinary skill in the art upon reference to the following detailed description taken in conjunction with the accompanying drawings.

BRIEF DESCRIPTION OF THE DRAWINGS

For a better understanding of the invention, and to show by way of example how the same may be carried into effect, reference is now made to the detailed description of the invention along with the accompanying figures in which corresponding numerals in the different figures refer to corresponding parts and in which:

FIG. 2e provides an illustration depicting certain embodiments of a semiconductor device segment according to the present invention; and FIGS. 3a-3c provide illustrations depicting several embodiments of a semiconductor device segment according to the present invention.

DETAILED DESCRIPTION OF THE INVENTION

Figure 1A:
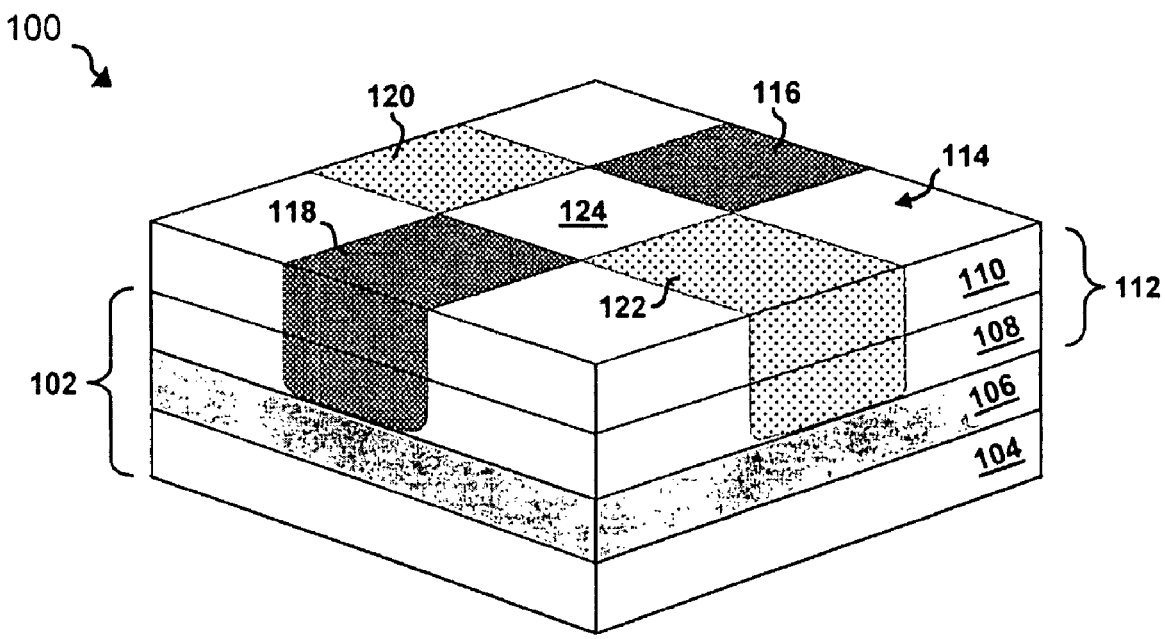
FIGS. 1a and 1b provide illustrations depicting one embodiment of a semiconductor device segment according to the present invention.

While the making and using of various embodiments of The present invention are discussed in detail below, it should be appreciated that the present invention provides many applicable inventive concepts, which can be embodied in a wide variety of specific contexts. The present invention is hereafter illustratively described in conjunction with the design and production of JFET structures utilizing a MOS-type semiconductor process technology. The specific embodiments discussed herein are, however, merely demonstrative of specific ways to make and use the invention and do not limit the scope of the invention.

Comprehending a number of inefficiencies and limitations arising from conventional JFET designs, the present invention provides a versatile system for the design and production of high performance JFET structures. The present invention overcomes detrimental effects of processing imprecision during the production of curtain transistor features—particularly the channel region. The present invention provides a simple and efficient system for optimizing the effective dimensions, and several other characteristics of a transistor channel region—thereby optimizing a JFET's performance.

Among its structures and methods, the system of the prevent invention provides a highly versatile cross-lateral JFET architecture—one that is readily adaptable to optimize a JFET for a number of design or performance requirements. In addition to having an extremely versatile architecture, JFETs of the present invention provide high current throughput at high voltages and high frequencies—making them a viable substitute for MOSFETs in certain applications. Utilizing the present invention, high-performance JFETs may be produced in-process, using commercially viable semiconductor process technologies (e.g., advanced bipolar/CMOS).

The cross-lateral JFET architecture of the present invention comprises a double-gate branch disposed orthogonally to a source/drain branch—thereby bounding a central channel region. By this architecture, the present invention provides improved channel length control (in comparison to conventional designs). The double-gate branch of the present invention provides a well-defined gate modulation region across the channel. In comparison to conventional designs, the architecture of the present invention obviates or eliminates sidewall parasitic capacitance effects—providing for optimization of JFET frequency performance through channel length variation. The dual gates of the present invention are disposed laterally opposite, across a channel stricture. This lateral architecture provides easy, practical front-side routing and contact for both gates. Having full, practical use of both gates, the architecture of the present invention provides dynamic pinch-off across the channel—doubling the JFET's drive current, and improving its gain ($g_m$).

The outermost regions of each cross-lateral branch (i.e., the ends farthest from the channel) may be tailored or configured to provide a desired physical or behavioral property (e.g., gate contact size, gate resistance). More specifically, the present invention provides easy access to each cross-lateral branch while readily integrating with existing process flows—providing for a number of in-process variations (e.g., increasing or decreasing dopant concentration). Such process variations may be performed independent of, or combination with, alterations in the topology of various branches to provide a JFET optimized to a desired set of performance specifications (e.g., high voltage, high frequency).

Certain aspects of the present invention are described in greater detail now, beginning with reference to FIG. 1a—which depicts a cut-away cross-sectional view of a portion of a semiconductor device segment 100 in accordance With the present invention. Segment 100 comprises a silicon-on-insulator (SOI) type substrate 102. Substrate 102 comprises a foundation layer 104 (e.g., silicon), an insulator layer 106 (e.g., oxide), and a thin silicon layer 108. In alternative embodiments, substrate 102 may comprise other appropriate substrate materials, depending upon the desired JFET performance characteristics or the specific fabrication processes used.

Depending upon the actual thickness of layer 108, an additional layer of silicon 110 may be disposed atop layer 108 in order to provide a working silicon layer 112 of a desired or required silicon thickness for JFET formation. Layer 110 may be provided in any suitable process-compatible manner, such as epitaxial silicon growth.

Deep trench isolation (DTI) and, in some embodiments, shallows trench isolation (STI), are utilized in conjunction with standard process flow operations (i.e., pattern, etch, implant), as described below, to form a cross-lateral transistor structure 114 from layer 112. Structure 114 comprises a first gate branch 116, a second gate branch 118, a source branch 120, a drain branch 122, and a channel region 124.

For purposes of explanation and illustration, structure 114 is formed as an N-channel JFET. In alternative embodiments, structure 114 may be formed as a P-channel JFET—reversing the physical and operational polarities of each substructure, component or region, where appropriate. Channel region 124 is doped with an appropriate n-type material (e.g., As, P). In segment 100, doping for channel region 124 is performed concurrent with the formation of layer 110—in order to optimize the post-processing definition of channel region 124. In alternative embodiments, doping for channel region 124 is performed after layer 110 is formed. In such embodiments, however, doping will have to implant to an appropriate depth for proper channel formation, and some channel boundary anomalies (e.g., diffusive flare) may occur.

Source region 120 and drain region 122 are formed (e.g., pattern, etch) and heavily doped with an n-type material (e.g., As, P). Gate regions 116 and 118 are formed (e.g., pattern, etch) and heavily doped with a p-type material (e.g., B). For purposes of illustration and explanation, FIG. 1a depicts regions 116, 118, 120 and 122 as sharply defined features having uniform doping density throughout, in order to illustrate certain aspects of structure 114. It should be apparent, however, that most fabrication processes—particularly implantation processes—are not capable of such precision and uniformity. Such instances are comprehended by present invention nonetheless. In such embodiments, therefore, outer areas or portions of one or more of regions 116, 118, 120 and 122 may be characterized by gradual or abrupt decreases in dopant density.

Figure 1B:
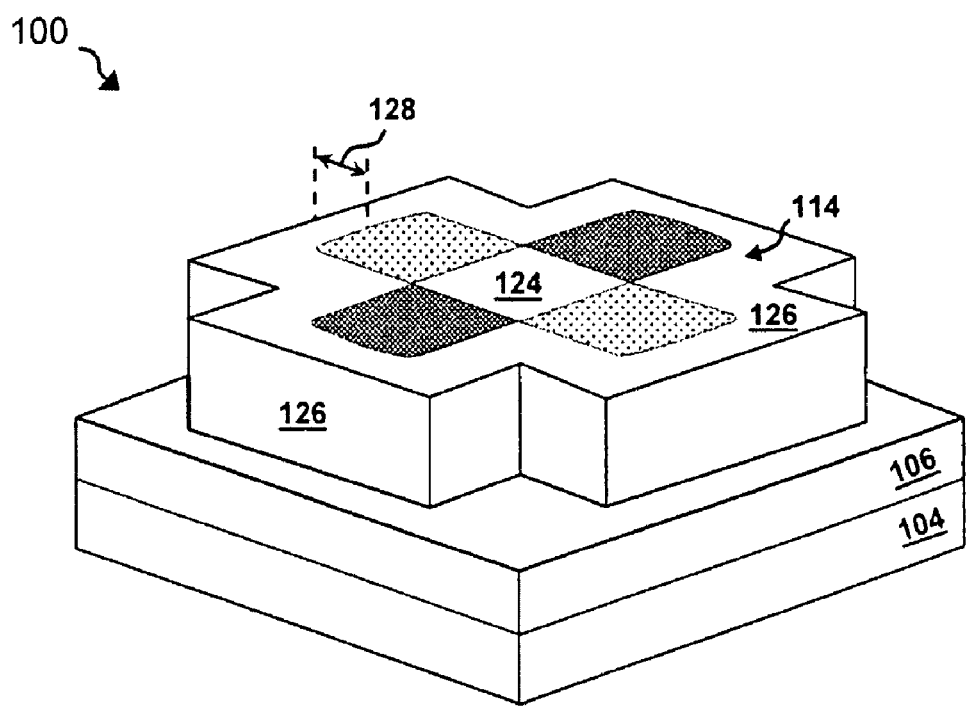

Referring now to FIG. 1b, which depicts segment 100 in a partial cutaway view, deep trench isolation is performed on segment 100, rendering a deep trench isolation perimeter 126 surrounding structure 114. The dimension and topology of perimeter 126 may be varied to account for process or design variations, as required or desired. Perimeter 126 thereafter bounds structure 114 around its outer perimeter by some minimal dimension 128. Perimeter 126 provides operational isolation of structure 114 from adjacent devices or structures. In certain embodiments, DTI may be the only isolation technique employed. Thus, after DTI, appropriate contact structures (e.g., silicide contacts) may be formed upon an outer portion of each of the source, drain and gate regions of structure 114.

Figure 2A:
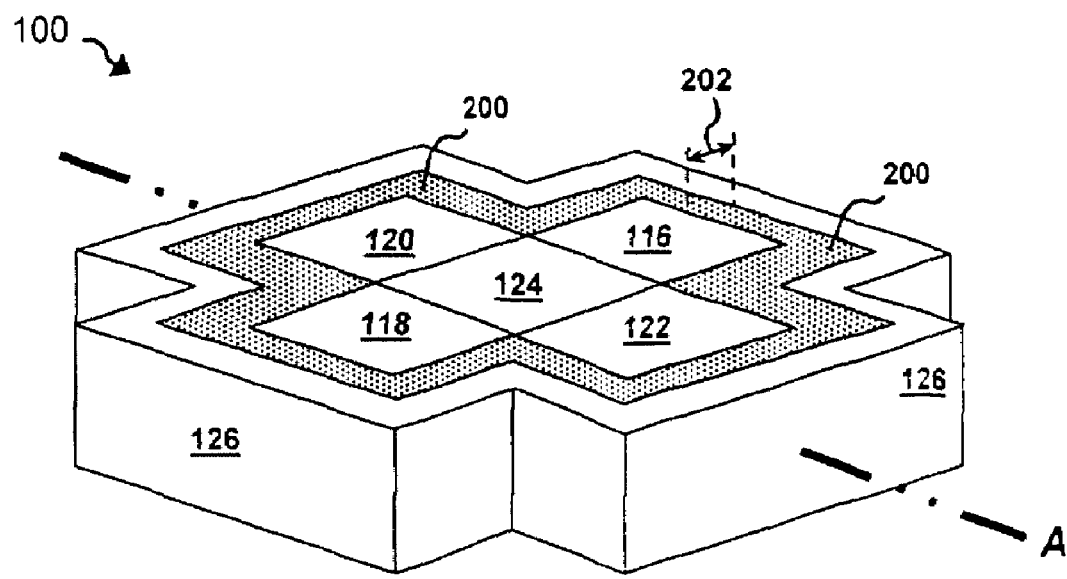
FIGS. 2a and 2b provide illustrations depicting another embodiment of a semiconductor device segment according to the present invention.
Figure 2B:
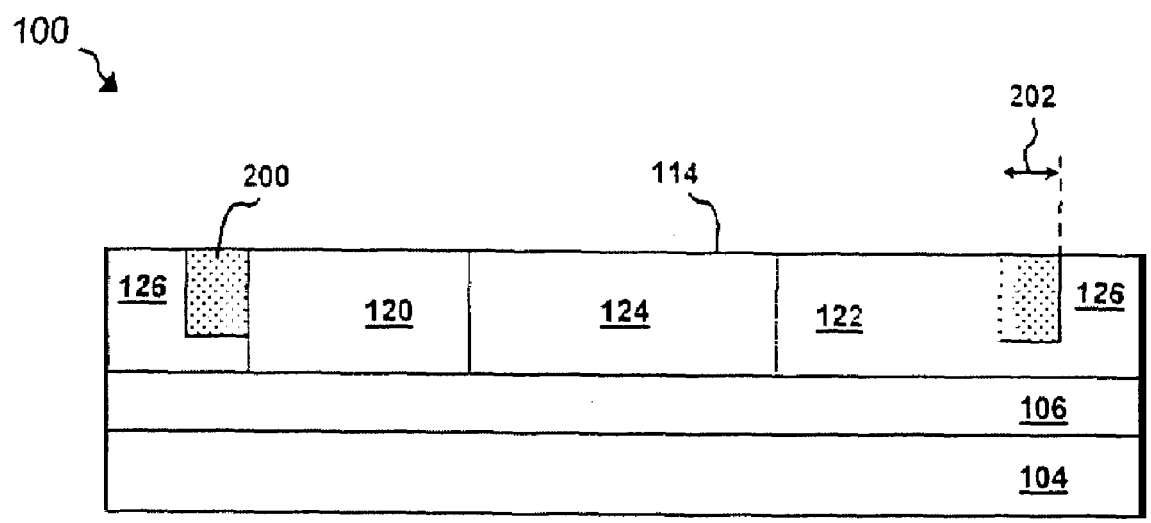

In other embodiments, as depicted now with reference to FIG. 2a, and to FIG. 2b, which shows a cross-sectional view of segment 100 taken along axis A of FIG. 2a, STI may be performed on segment 100 to further define and isolate structure 114. A shallow trench 200 may be patterned and formed, within perimeter 126, to form an inner perimeter around structure 114. Trench 200 is generally formed having a uniform width 202 (e.g., 0.25 µm-0.5 µm) around structure 114. Depending upon particular design or fabrication requirements or restrictions, trench 200 may partially or completely overlap (i.e., cut into) perimeter 126 or partially or completely overlap an outer portion of branches 116, 118, 120 or 122. Once shallow trench 200 has been formed, appropriate contact structures (e.g., silicide contacts) may be formed upon an outer portion of each of the source, drain and gate regions of structure 114.

In other embodiments, STI may be further employed to form a body isolation structure 204 over some portion of structure 114—particularly the channel region 124. This is illustrated now in reference to FIG. 2c, and to FIG. 2d, which depicts a cross-sectional view of segment 100 taken along axis B of FIG. 2c. Isolation structure 204 may be formed of an appropriate isolation material (e.g., oxide), and in a configuration that leaves appropriately dimensioned contact areas 206 along the upper surface of the outer portion of each of the source, drain and gate regions. Depending upon the nature of the processes used to construct structure 114, the degree to which structure 204 covers the branches of structure 114 may be varied. For example, in certain embodiments, structure 204 may be formed to cover only the channel region 124.

Once the gate 116 and 118, source 120, drain 122 and channel 124 regions are adequately formed, and any desired or required isolation structures have been formed, appropriate contact structures (e.g., silicide contacts) are formed upon the source, drain and gate regions at areas 206. In certain embodiments, additional doping of regions 116, 118, 120 or 122 may be performed, via areas 206, prior to the formation of contact structures. According to the present invention, the doping profiles of each such region may be selectively altered to provide a desired performance characteristic of the JFET—such as increasing the operational voltage range. This aspect of the present invention in described in greater detail in reference now to FIG. 2e.

Figure 2C:
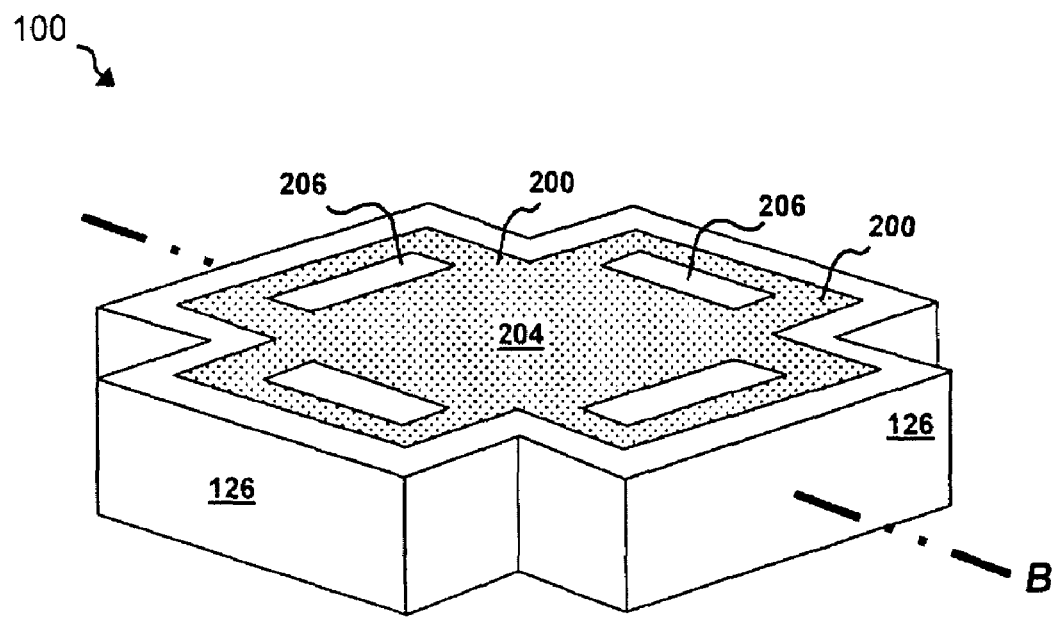
FIGS. 2c and 2d provide illustrations depicting another embodiment of a semiconductor device segment according to the present invention.
Figure 2D:
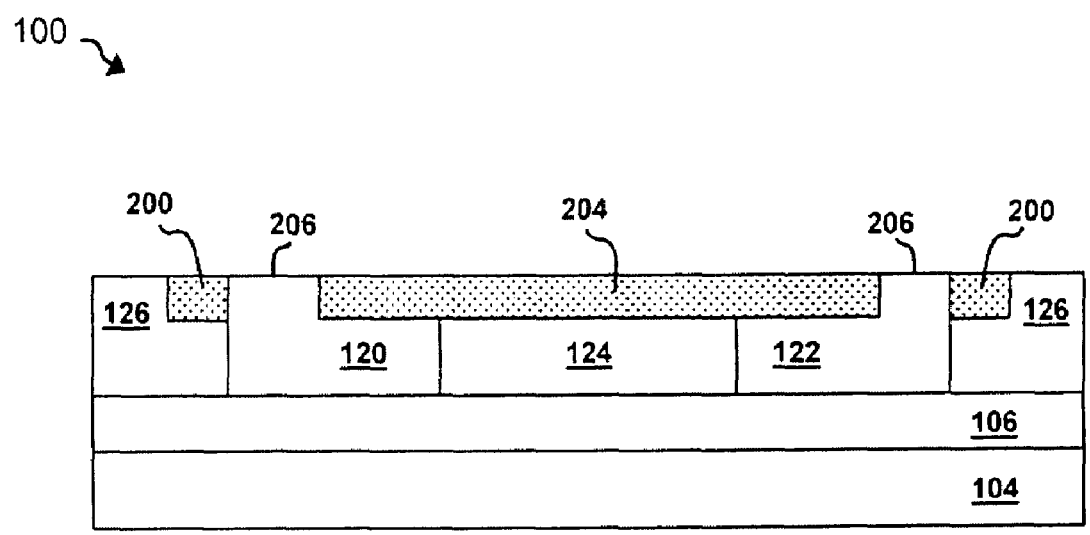

FIG. 2e depicts a cross-sectional view of structure 114 taken along axis B of FIG. 2c. In the embodiment depicted in FIG. 2e, an isolation structure 204 may be formed covering primarily channel 124—with minimal or differing coverage over, for example, source 120 or drain 122. This formation provides access to the source, drain or gate regions of structure 114 for selective, independent implantation at any point therealong. In certain embodiments, for example, standard source/drain implants 208 may be sufficient to provide desired operational characteristics for segment 100. In other embodiments, for example, an additional deep implant 210 may be performed on one or more of the branches to provide a desire doping profile, thereby providing the JFET with certain desired performance characteristics (e.g., higher operational voltage). In still other embodiments (e.g., extended drain topologies), multiple implants 212 may be performed along a branch region to render a desired doping profile. Thus, according to the present invention, the lateral arrangement of the JFET structure provides easy access to selectively and independently dope specific device regions, thereby providing an efficient alteration or customization of JFET performance Upon completion, structure 114 comprises a selectively doped, dual-gate, buried channel device—providing a high-performance JFET formed within a single, horizontal plane.

The JFET architecture thus depicted is extremely versatile in its form and function. The formation or topology of structure 114 may be further varied in a number of ways to provide necessary or desired physical or behavioral characteristics. In order to alter the JFET pinch-off voltage, for example, the doping of channel 124 may be increased and the width of channel 124 decreased, or vice versa. A number of topological variations, as depicted now in FIGS. 3a-3c, may also be utilized to provide certain performance characteristics.

In FIG. 3a, for example, topology 300 provides for a transistor structure with one or more branches having an augmented end. In topology 300, gates 302 and 304 are formed with expanded contact regions of non-rectangular shape (i.e., rounded, polygonal)—decreasing gate resistance and increasing transistor gain. Source or drain contact regions may also be formed in rounded (e.g., circular or semi-circular) shapes (e.g., gate 302, polygonal shapes (e.g., gate 304), or combinations thereof, to facilitate contact formation or to alter transistor performance characteristics in a desired manner. In topology 306, as depicted in FIG. 3b, an elongated drain branch 308 is provided. This topology provides a drain-enhanced JFET, having an increased operational voltage. Implemented in conjunction with selective doping along branch 308, a desired voltage characteristic may be readily provided.

A ladder-type topology 310 is illustrated in FIG. 3c. The JFET of topology 310 comprises a single, central gate/channel branch 312, crossed by multiple source/drain branches 314—forming, effectively, a lateral stacking of multiple structures 114. This topology may be utilized to provide a JFET of desired current capacity by forming a channel of appropriate dimension—while still retaining other benefits of the present invention. Depending upon the process technology used, the channel length may be varied, for example, from ~0.6 µm to 5.0 µm.

Thus, by the present invention, an extremely versatile cross-lateral JFET architecture system is provided. The system of the present invention is readily adaptable to a number of semiconductor fabrication processes, and produces a JFET having readily designable high-performance characteristics. The architecture of the present invention provides a fully usable double-gate structure, improving device gain. The system of the present invention provides a well-defined channel area—reducing capacitive non-linearities and optimizing current throughput. Furthermore, according to the present invention, very minor alterations in structure dimension or composition (i.e., doping profiles) may be utilized to efficiently and easily provide a wide range of operational voltages (e.g., ~10 V-100 V). These and other variations and combinations are hereby comprehended.

The embodiments and examples set forth herein are therefore presented to best explain the present invention and its practical application, and to thereby enable those skilled in the art to make and utilize the invention. However, those skilled in the art will recognize that the foregoing description and examples have been presented for the purpose of illustration and example only. The description as set forth is not intended to be exhaustive or to limit the invention to the precise form disclosed. As stated throughout, many modifications and variations are possible in light of the above teaching without departing from the spirit and scope of the following claims.

What is claimed is:

1. A system for providing a junction field effect transistor having desired voltage, frequency or current characteristics, the system comprising:
   providing a substrate;
   forming a channel structure along the substrate;
   forming a dual-gate structure along the substrate, laterally adjoining the channel structure on opposite sides thereof;
   forming a source structure along the substrate, laterally adjoining the channel structure orthogonal to the dual-gate structure; and
   forming a drain structure along the substrate, laterally adjoining the channel structure, opposite the source structure and orthogonal to the dual-gate structure.

2. The system of claim 1, wherein a desired voltage characteristic of the junction field effect transistor is produced by highly doping, and decreasing the width of, the channel structure.

3. The system of claim 1, wherein a desired voltage characteristic of the junction field effect transistor is produced by increasing the width of, and lightly doping, the channel structure.

4. The system of claim 1, wherein a desired voltage characteristic of the junction field effect transistor is produced by forming an elongated drain structure.

5. The system of claim 1, wherein a desired voltage characteristic of the junction field effect transistor is produced by selectively doping one of dual gate structure, the drain structure, or the source structure.

* * * * *